(12) United States Patent
Cheng et al.

(10) Patent No.: US 10,170,372 B2
(45) Date of Patent: Jan. 1, 2019

(54) FINFET CMOS WITH SI NFET AND SIGE PFET

(71) Applicant: INTERNATIONAL BUSINESS MACHINES CORPORATION, Armonk, NY (US)

(72) Inventors: Kangguo Cheng, Schenectady, NY (US); Ramachandra Divakaruni, Ossining, NY (US); Jeehwan Kim, Cambridge, MA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/186,964

(22) Filed: Jun. 20, 2016

(65) Prior Publication Data
US 2017/0170180 A1    Jun. 15, 2017

Related U.S. Application Data

(62) Division of application No. 14/969,833, filed on Dec. 15, 2015, now Pat. No. 9,484,347.

(51) Int. Cl.
*H01L 27/092* (2006.01)
*H01L 21/8238* (2006.01)
(Continued)

(52) U.S. Cl.
CPC .. *H01L 21/823821* (2013.01); *H01L 21/3065* (2013.01); *H01L 21/823807* (2013.01); *H01L 21/823878* (2013.01); *H01L 27/0922* (2013.01); *H01L 27/0924* (2013.01); *H01L 29/0649* (2013.01); *H01L 29/0673* (2013.01); *H01L 29/0676* (2013.01); *H01L 29/161* (2013.01);
(Continued)

(58) Field of Classification Search
CPC ............. H01L 29/0649; H01L 29/0673; H01L 29/161; H01L 29/165; H01L 27/0922; H01L 27/0924
See application file for complete search history.

(56) References Cited

U.S. PATENT DOCUMENTS 7,224,033 B2 * 5/2007 Zhu ..................... H01L 29/4908
257/353
7,387,937 B2   6/2008 Anderson et al.
(Continued)

OTHER PUBLICATIONS

List of IBM Patents or Patent Applications Treated as Related dated Jun. 20, 2016, 2 pages.

*Primary Examiner* — Matthew Reames
(74) *Attorney, Agent, or Firm* — Tutunjian & Bitetto, P.C.; Vazken Alexanian

(57) ABSTRACT

A method for forming a complementary metal oxide semiconductor (CMOS) device includes growing a SiGe layer on a Si semiconductor layer, and etching fins through the SiGe layer and the Si semiconductor layer down to a buried dielectric layer. Spacers are formed on sidewalls of the fins, and a dielectric material is formed on top of the buried dielectric layer between the fins. The SiGe layer is replaced with a dielectric cap for an n-type device to form a Si fin. The Si semiconductor layer is converted to a SiGe fin for a p-type device by oxidizing the SiGe layer to condense Ge. The dielectric material is recessed to below the spacers, and the dielectric cap and the spacers are removed to expose the Si fin and the SiGe fin.

15 Claims, 9 Drawing Sheets

(51) Int. Cl.
*H01L 29/06* (2006.01)
*H01L 29/66* (2006.01)
*H01L 29/78* (2006.01)
*H01L 29/161* (2006.01)
*H01L 21/3065* (2006.01)
*H01L 29/165* (2006.01)
*H01L 29/775* (2006.01)
*H01L 21/324* (2006.01)

(52) U.S. Cl.
CPC ...... *H01L 29/165* (2013.01); *H01L 29/66439* (2013.01); *H01L 29/785* (2013.01); *H01L 29/7831* (2013.01); *H01L 21/3247* (2013.01); *H01L 21/823885* (2013.01); *H01L 27/092* (2013.01); *H01L 29/775* (2013.01)

(56) References Cited

U.S. PATENT DOCUMENTS

| | | | |
|---|---|---|---|
| 7,993,999 B2* | 8/2011 | Basker | H01L 21/845 438/151 |
| 8,440,511 B1* | 5/2013 | Liao | H01L 21/306 438/157 |
| 8,460,990 B2 | 6/2013 | Kim et al. | |
| 8,828,818 B1 | 9/2014 | Rodder | |
| 8,901,664 B2 | 12/2014 | Basker et al. | |
| 8,951,870 B2 | 2/2015 | Basker et al. | |
| 8,975,168 B2 | 3/2015 | Liu et al. | |
| 8,987,836 B2* | 3/2015 | Kim | H01L 29/785 257/288 |
| 9,093,533 B2 | 7/2015 | Cheng et al. | |
| 9,558,942 B1* | 1/2017 | Duriez | H01L 21/02603 |
| 2004/0048424 A1* | 3/2004 | Wu | H01L 21/84 438/154 |
| 2012/0199909 A1* | 8/2012 | Schulz | H01L 21/823821 257/351 |
| 2014/0027860 A1* | 1/2014 | Glass | H01L 21/823807 257/401 |
| 2014/0353760 A1 | 12/2014 | Loubet et al. | |
| 2014/0357060 A1* | 12/2014 | Liu | H01L 21/02664 438/479 |
| 2015/0228780 A1 | 8/2015 | Cheng et al. | |

* cited by examiner

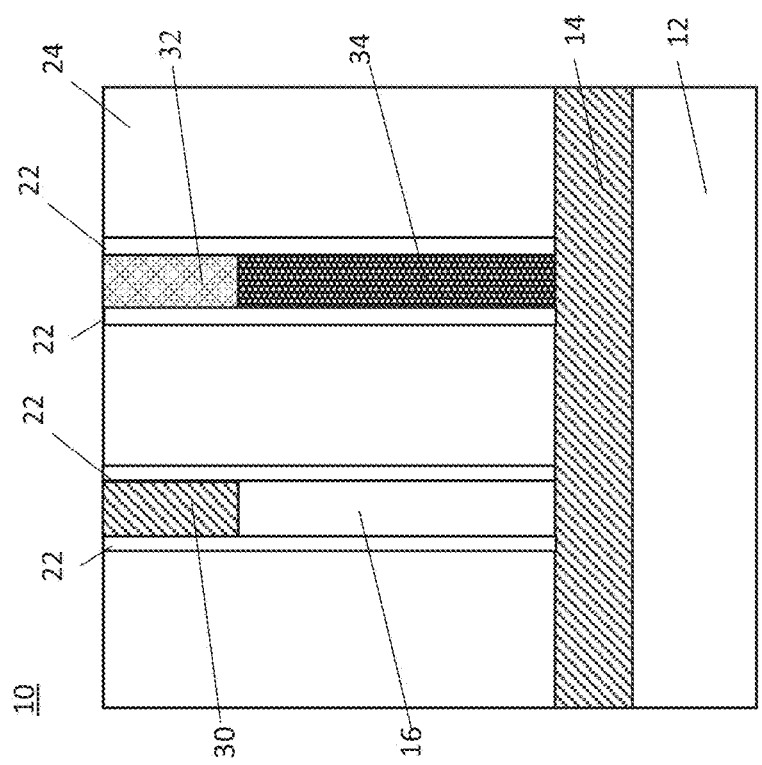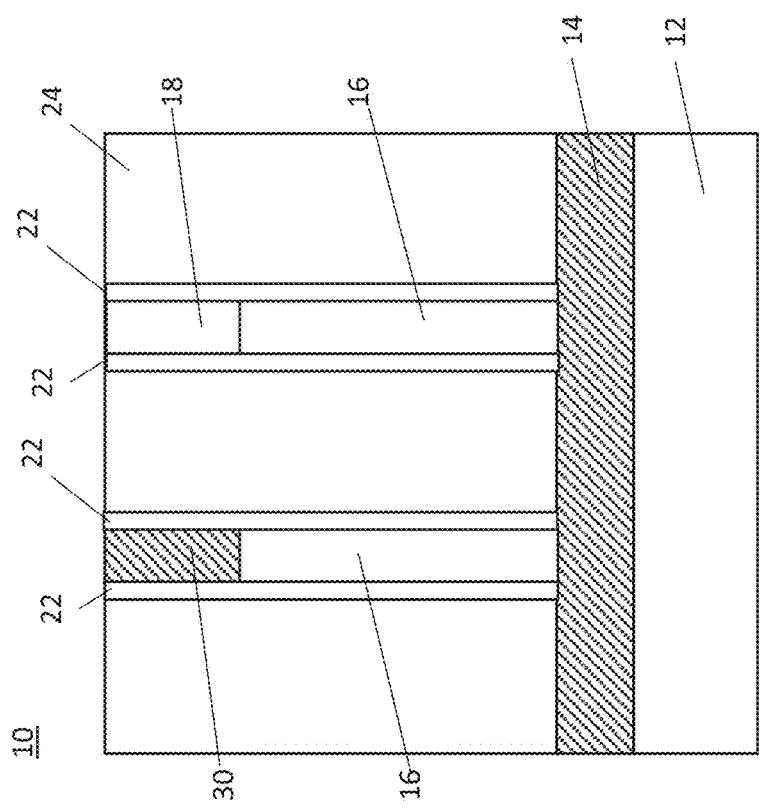

FINFET CMOS WITH SI NFET AND SIGE PFET

BACKGROUND

Technical Field

The present invention relates to semiconductor processing, and more particularly to complementary metal oxide semiconductor devices having different materials for n-type and p-type fin devices on a same chip.

Description of the Related Art

Fin field effect transistors (finFETs) have become a mainstream complementary metal oxide semiconductor (CMOS) technology since 22 nm nodes have been implemented. To further improve finFET CMOS performance, Si n-type FETs (NFETs) and SiGe p-type FETs (PFETs) have been pursued for smaller nodes sizes.

A conventional approach for Si NFETs and SiGe PFETs includes recessing Si in a PFET region, epitaxially growing a SiGe block in the PFET region, and then forming Si fins and SiGe fins by patterning and reactive ion etching (RIE). Since Si and SiGe have different etch rates a practical problem arises using this approach. For example, Si fins and SiGe fins have different fin widths after fin patterning. Different fin widths cause a number of processing and structural issues that render the conventional techniques less than optimal.

SUMMARY

A method for forming a complementary metal oxide semiconductor (CMOS) device includes growing a SiGe layer on a Si semiconductor layer, and etching fins through the SiGe layer and the Si semiconductor layer down to a buried dielectric layer. Spacers are formed on sidewalls of the fins, and a dielectric material is formed on top of the buried dielectric layer between the fins. The SiGe layer is replaced with a dielectric cap for an n-type device to form a Si fin. The Si semiconductor layer is converted to a SiGe fin for a p-type device by oxidizing the SiGe layer to condense Ge. The dielectric material is recessed to below the spacers, and the dielectric cap and the spacers are removed to expose the Si fin and the SiGe fin.

Another method for forming a complementary metal oxide semiconductor (CMOS) device includes growing a SiGe layer on a Si layer as a blanket layer; etching fins through the SiGe layer and the Si layer down to a buried dielectric layer; forming spacers on sidewalls of the fins; filling between the fins with a dielectric material on top of the buried dielectric layer; replacing the SiGe layer with a dielectric cap for an n-type device to form a Si fin; converting the Si layer to a SiGe fin for a p-type device by oxidizing the SiGe layer to condense Ge; recessing the dielectric material to below the spacers; removing the dielectric cap and the spacers to expose the Si fin and the SiGe fin and to form a pedestal in the buried dielectric layer upon which each Si fin and SiGe fin rests; forming a gate structure transversely to the S fins and the SiGe fin and epitaxially growing source and drain regions on the Si fin and the SiGe fin to form a CMOS device.

A complementary metal oxide semiconductor (CMOS) device includes pedestals formed in a buried dielectric layer. A SiGe fin and a Si fin are each formed on the pedestals. The SiGe fin and the Si fin include a same or substantially the same width dimension.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein:

FIG. 4 is a cross-sectional view of the semiconductor device of FIG. 3 having n-type devices blocked by a cap in accordance with the present principles;

FIG. 5 is a cross-sectional view of the semiconductor device of FIG. 4 having the SiGe oxidized to move Ge to the Si portion of the fin to form SiGe fins for p-type devices in accordance with the present principles;

DETAILED DESCRIPTION

Figure 1:
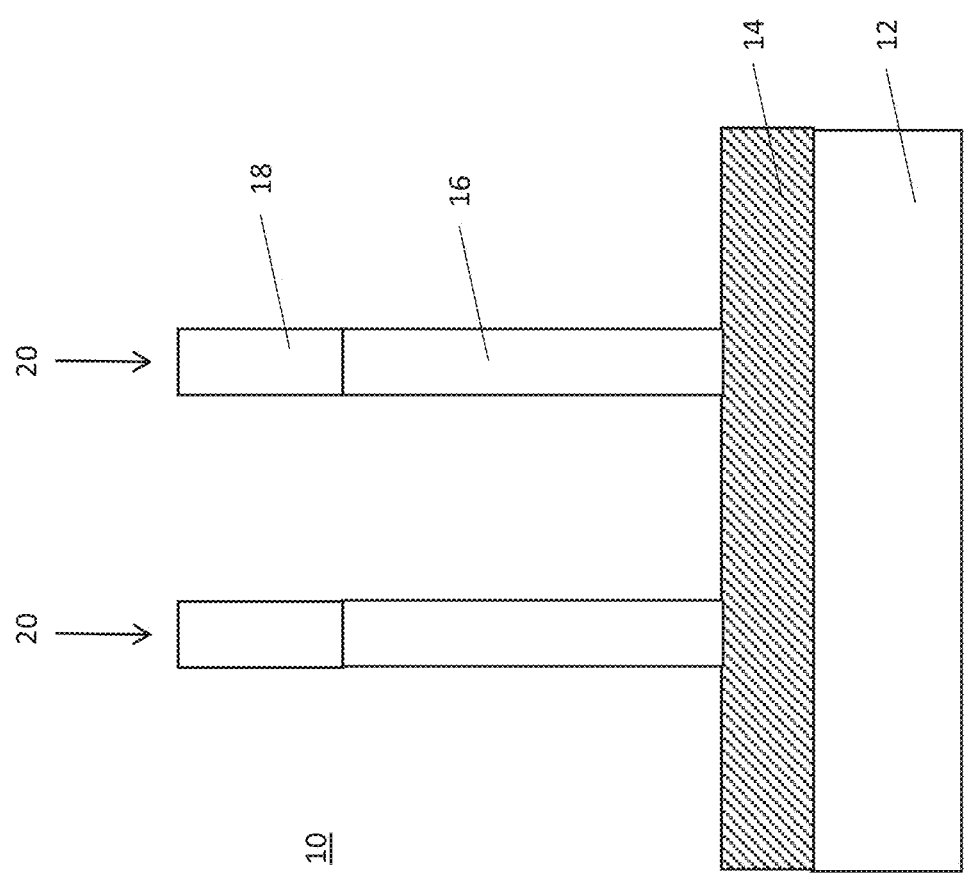
FIG. 1 is a cross-sectional view of a semiconductor device having a blanket deposited or grown SiGe layer formed on a Si layer and patterned to form fins (vertical/columnar or horizontal/longitudinal) in accordance with the present principles.

In accordance with the present principles, devices and methods for integrating these devices are provided. In useful embodiments, fin field effect transistors (finFETs) for complementary metal oxide semiconductor (CMOS) devices include Si n-type field effect transistors (NFETs) and SiGe p-type field effect transistors (PFETs) on a same chip where the Si fins and SiGe fins have a same fin width.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, one embodiment of a substrate structure or wafer 10 may include a semiconductor-on-insulator (SOI) structure that includes a base substrate 12 of a semiconductor material, a dielectric layer 14 and a semiconductor layer 16. The base substrate 12 may include Si, Ge, SiGe alloys, SiGe:C, SiC, Si:C, GaAs, InAs, InP, as well as other III-V or II-VI compound semiconductors. The base substrate 12 may include amorphous, polycrystalline or monocrystalline material.

The dielectric layer 14 may include a buried oxide (BOX) layer although other dielectric materials may be employed. The semiconductor layer 16 is present on the dielectric layer 14. The semiconductor layer 16 may include Si, Ge, SiGe alloys, SiGe:C, SiC, Si:C, etc. In a particularly useful embodiment, the semiconductor layer 16 includes monocrystalline Si.

Another semiconductor layer 18 is epitaxially grown on the semiconductor layer 16. The semiconductor layer 18 preferably includes SiGe and is formed on the entire wafer (10) (e.g., blanket deposited). The term "epitaxial" denotes that a material is formed using an epitaxial growth process. The terms "epitaxial growth and/or deposition" and "epitaxially formed" mean the growth of a material on a deposition surface of a semiconductor material, in which the material being grown has the same crystalline characteristics, e.g., crystalline plane orientation, as the semiconductor material of the deposition surface.

Fins (or columns) 20 are formed on the wafer 10. In one embodiment, the layers 16 and 18 are patterned using a lithography process across the wafer 10. The lithography process may include forming a resist mask and etching, e.g., using a reactive ion etch (RIE) process, to form fins 20 with two materials (e.g., Si for layer 16 and SiGe for layer 18). Up to this point in the process, all fins 20 are identical in structure and materials across the entire wafer 10. Other suitable patterning techniques such as, e.g., sidewall image transfer (SIT) can be employed to form the fins.

Figure 2:
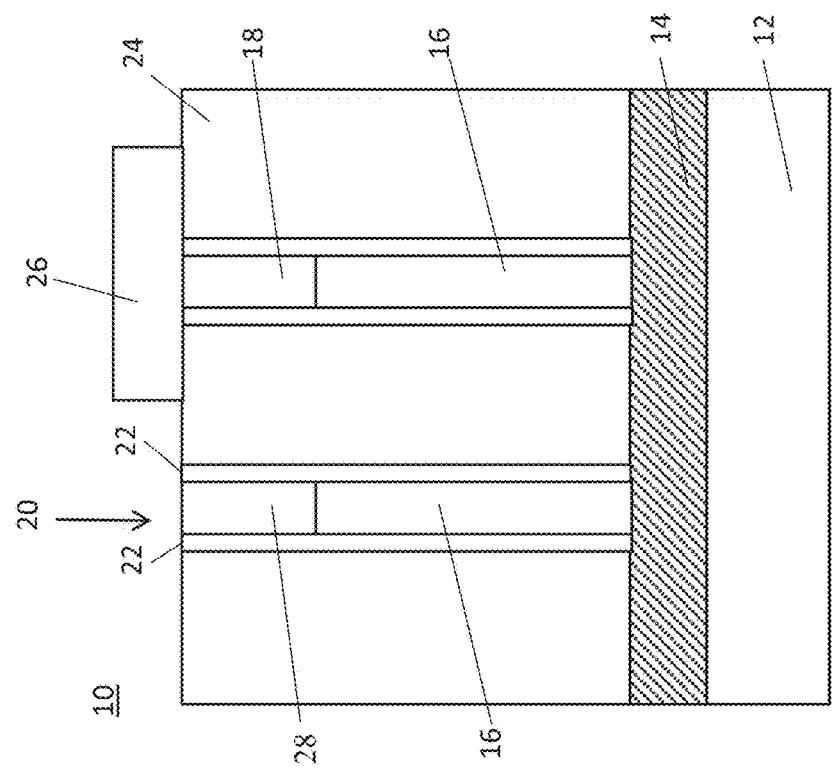
FIG. 2 is a cross-sectional view of the semiconductor device of FIG. 1 having spacers formed on the fins and a shallow trench isolation (STI) material deposited to fill in between the fins in accordance with the present principles.

Referring to FIG. 2, spacers 22 are formed on fin sidewalls. The spacers 22 are formed by depositing a dielectric layer over the fins 20 and etching the dielectric layer to remove the spacer material from horizontal surfaces. The spacers 22 may include a nitride, such as silicon nitride. A dielectric material 24 is deposited over the fins 20 with spacers 22 and planarized, e.g., using a chemical mechanical polish (CMP) to provide a shallow trench isolation (STI) fill (24). The STI 24 may include an oxide, such as a silicon oxide.

Figure 3:
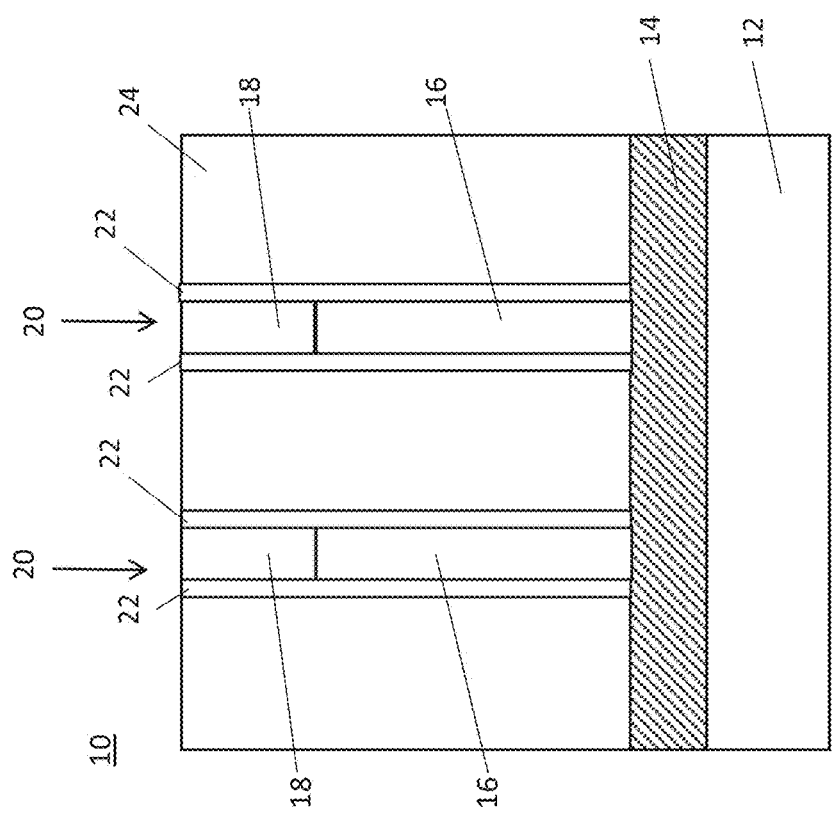
FIG. 3 is a cross-sectional view of the semiconductor device of FIG. 2 having p-type devices blocked to remove the SiGe from fins used to form n-type devices in accordance with the present principles.

Referring to FIG. 3, a mask layer 26 is deposited over the wafer 10 and patterned to cover fins 20 that will be formed into p-type field effect transistors (PFETs). The mask layer 26 may include a resist, SiN, or any other suitable materials. Once the mask layer 26 has been formed and patterned, an etch process is performed to remove the semiconductor layer 18 from the expose fin 20. The exposed fins 20 will be processed to form n-type field effect transistors (NFETs). In one embodiment, the semiconductor layer 18 includes SiGe. The SiGe of semiconductor layer 18 is removed selectively relative to the STI 24, spacers 22 and semiconductor layer 16. After the etch, a recess 28 is formed for the exposed fin 20. In one embodiment, the exposed SiGe layer 18 is removed by a gas phase etchant, e.g., including hydrochloride acid at a temperature ranging from about 500 degrees C. to about 800 degrees C. In another embodiment, the exposed SiGe layer 18 is removed by using a wet etch process including, e.g., hydrogen peroxide.

Referring to FIG. 4, the recess 28 is filled with a cap material 30. The cap material 30 may include a nitride, such as, e.g., silicon nitride. The mask material 26 may be removed before depositing the cap material 30 or the cap material 30 may be placed over the mask material 26. A chemical-mechanical planarization (CMP) or other planarizing process may be employed to remove the excess cap material 30 and the mask material 26. The cap material 30 protects the underlying semiconductor layer 16 for the NFET while the semiconductor layer 18 is processed.

Referring to FIG. 5, the wafer 10 is subjected to an oxidation (condensation) process to drive elements downward from the semiconductor layer 18 into the semiconductor layer 16. In a particularly useful embodiment, the semiconductor layer 18 includes SiGe and the oxidation process drives the Ge into the semiconductor layer 16 to form a SiGe fin 34 for a PFET. The semiconductor layer 18 becomes a silicon oxide 32 in the oxidation (condensation) process.

The oxidation (condensation) process may include exposing the layer 18 to, e.g., oxygen, oxygen plasma or $H_2O$ vapor, at a temperature of between about 400 degrees C. to about 1050 degrees C. for one or more cycles. The process diffuses material into the semiconductor layer 16 through condensation. The semiconductor layer 18 preferably includes SiGe and oxidation has the effect of causing the Si in the SiGe layer 18 to form $SiO_2$, and the Ge to condense and diffuse into the semiconductor layer 16 to form a SiGe fin 34. For example, SiGe is converted into oxide and Ge is pushed downwards (condensation) into a lower portion (34) of the fin. The shape of fin 34 can be maintained (e.g., facet free) during and after the diffusion process, and the fin width is fixed by the spacers 22. The semiconductor layer 16 becomes a fin 16 for an NFET. The fin 16 is protected by cap 30 and spacers 22. In one embodiment, the condensation is performed such that after condensation, top surfaces of the fin 16 and fin 34 are substantially coplanar (e.g., Si fin 16 and SiGe fin 34 have the same or substantially the same heights, e.g., within 10%).

Figure 6:
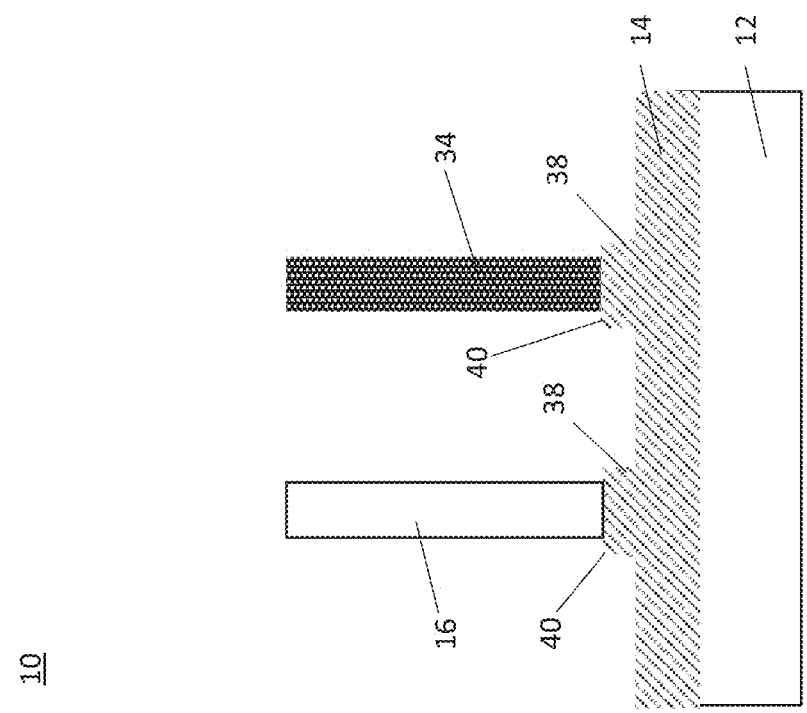
FIG. 6 is a cross-sectional view of the semiconductor device of FIG. 5 having the oxidized portion removed and the STI recessed in accordance with the present principles.

Referring to FIG. 6, the STI 24 is etched selectively to the cap 30, spacers 22 and fin 34. The STI recess removes the STI 24 and the silicon oxide in portion 32 of FIG. 5 that was converted from SiGe during the oxidation/condensation process. The STI recess etches a portion of the dielectric layer 14 to form a step 38. The step 38 is protected by the spacers 22 during the STI recess.

Figure 7:
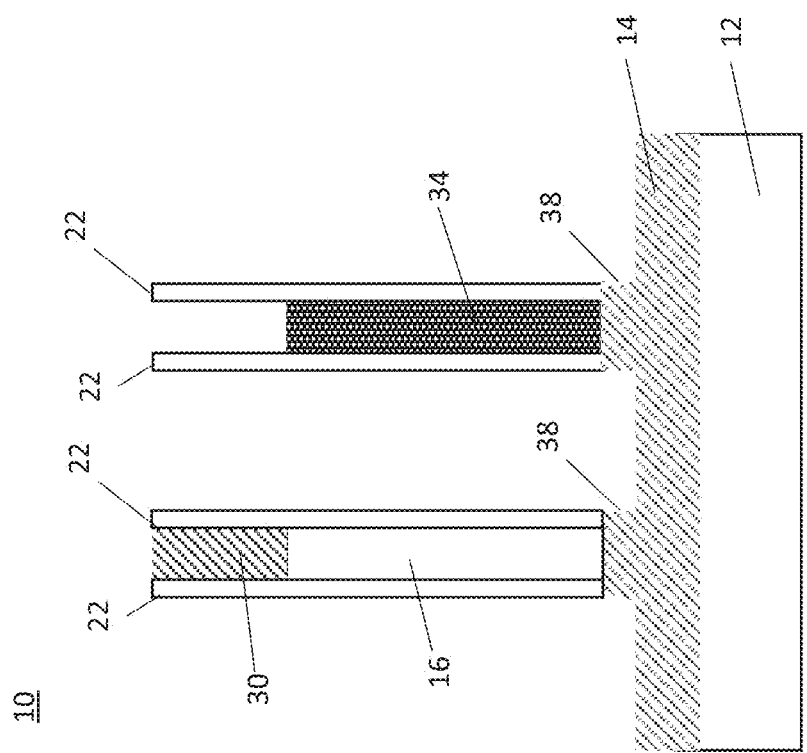
FIG. 7 is a cross-sectional view of the semiconductor device of FIG. 6 having the cap and the spacers removed to expose a Si fin and a SiGe fin in accordance with the present principles.

Referring to FIG. 7, the cap 30 and the spacers 22 are removed selective to the fins 16 and 34 and the dielectric layer 14. In one embodiment, the cap 30 and the spacers 22 include nitride, and the etch process includes a nitride strip. The removal of spacers 22 forms pedestals 40 on which the fins 16 and 34 are positioned. The fin 16 includes Si for the formation of NFET devices, and the fin 34 includes SiGe for the formation of PFET devices. The respective materials (Si, SiGe) promote higher carrier mobility in each of the respective device types on a same wafer or device.

Figure 8:
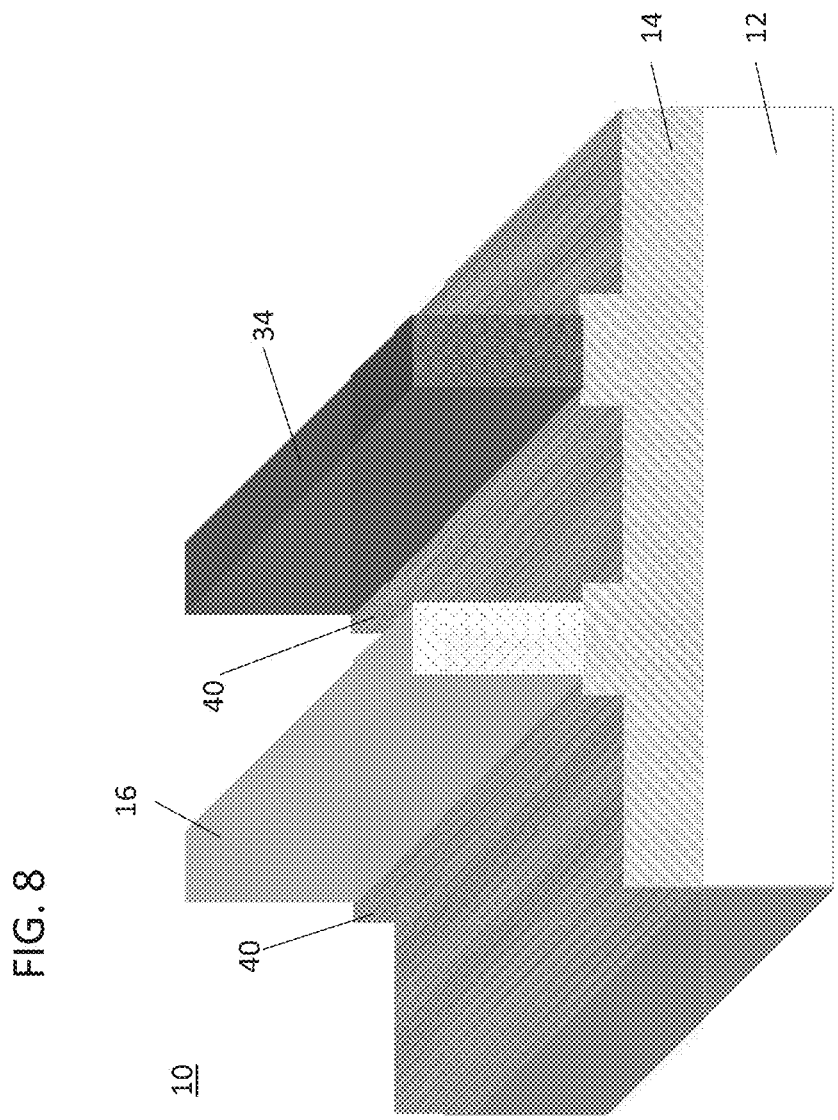
FIG. 8 is a perspective view of the device is shown having a Si fin and a SiGe fin in accordance with the present principles.

Referring to FIG. 8, a perspective view of the device 10 is shown in accordance with the present principles. The device 10 includes Si fin 16 and SiGe fin 34. The fin 16 includes Si for the formation of NFET devices, and the fin 34 includes SiGe for the formation of PFET devices. A greater number of fins 16 and 34 are contemplated and may be arranged in a plurality of orientations and arrangements. In one embodiment, the Si fins 16 and the SiGe fins may be disposed in an alternating arrangement. In other embodiments, any number of Si fins 16 may be formed adjacent to one another and any number of SiGe fins 34 may be arranged adjacent to one another.

The fins 16 and 34 are provided on pedestals 40 that extend below the fins 16, 34. Since the fins 16, 34 were originally formed using the same materials that blanketed the entire surface of the substrate, were patterned together and were disposed between spacers 22, the fins 16 and 34 include at least a same or substantially the same width.

Figure 9:
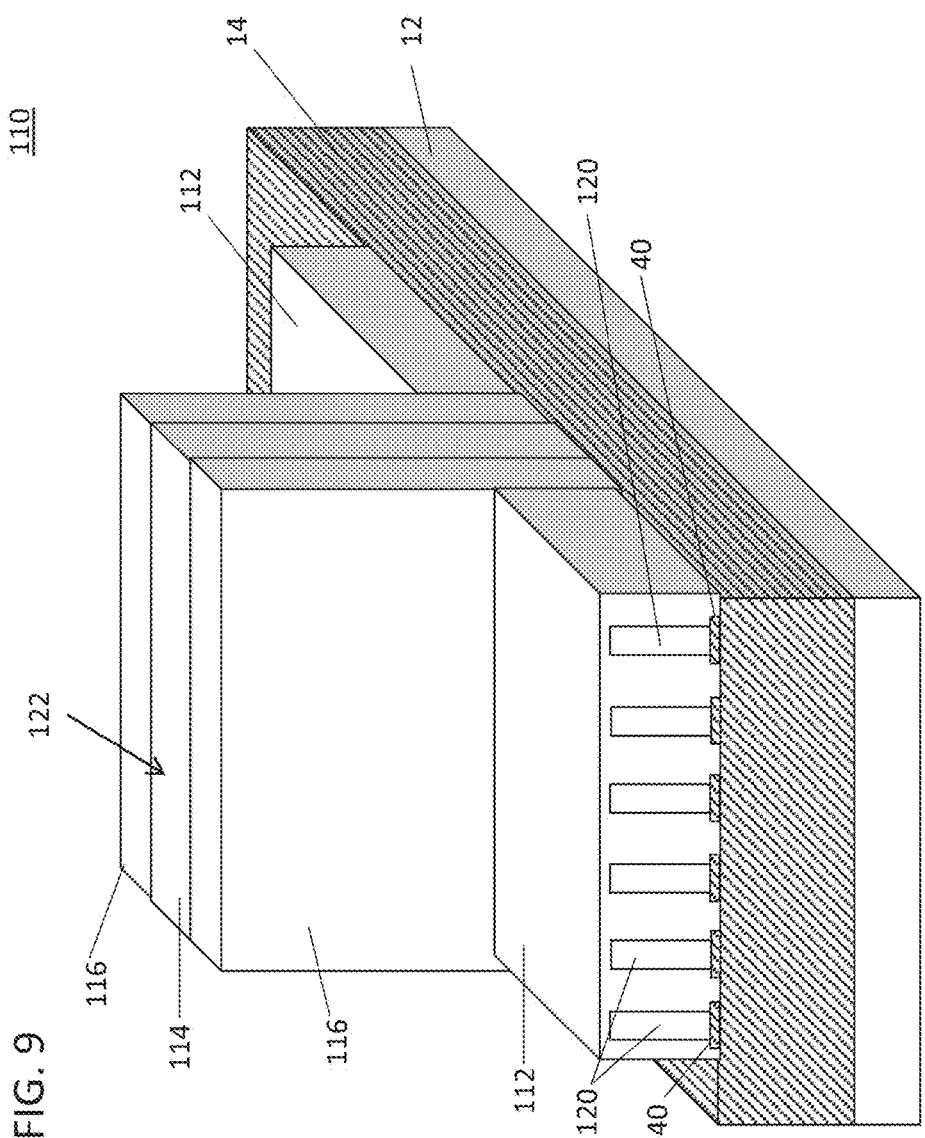
FIG. 9 is a perspective view of a finFET device showing Si fins and/or SiGe fins on pedestals in accordance with the present principles.

Referring to FIG. 9, a perspective view of a completed finFET device 110 is shown in accordance with the present principles. Device 110 includes fins 120 on pedestals 40. The fins 120 may include Si or SiGe depending on the type of device employed (e.g., NFET or PFET). The fins 120 are employed to epitaxially grow source and drain regions 112 on opposite sides on a gate structure 122. The gate structure 122 includes a gate conductor 114 formed over the fins 120. The gate conductor 122 is formed on a gate dielectric (not shown) and in between spacers 116. Other finFET, planar or other device structures may also be employed.

Figure 10:
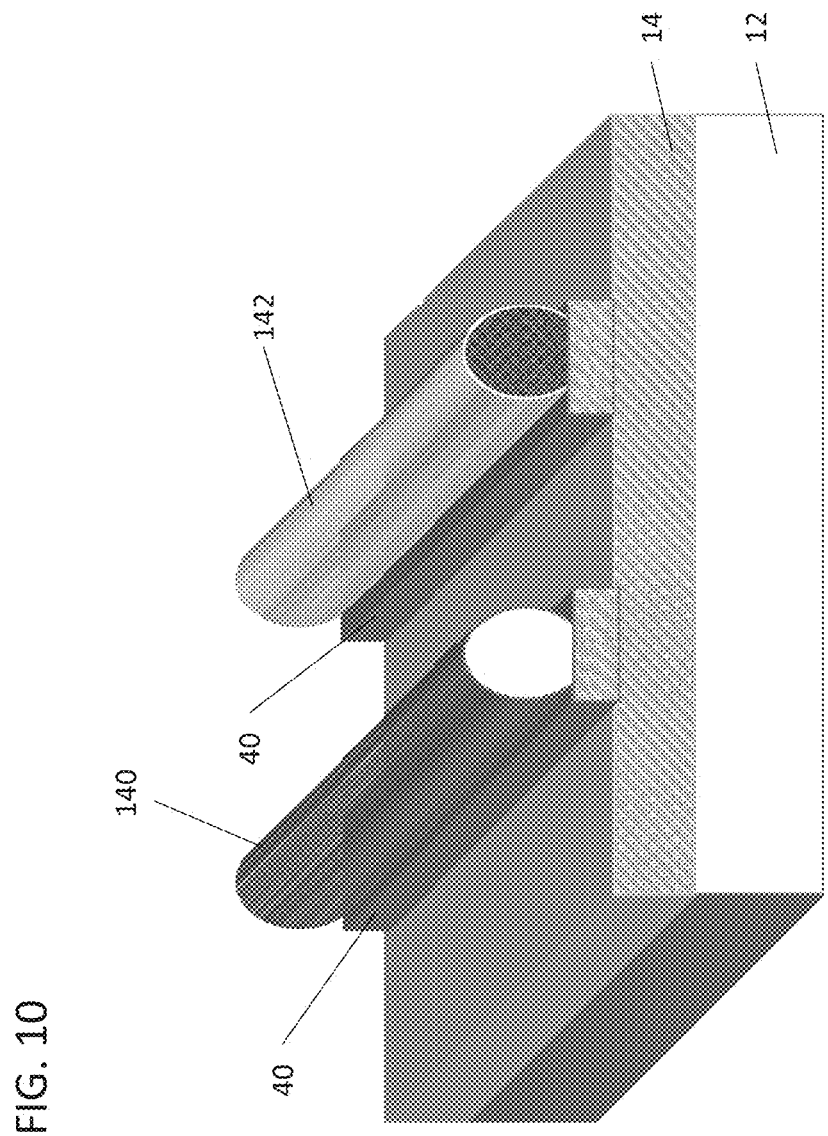
FIG. 10 is a perspective view of the device of FIG. 8 showing the Si fin and the SiGe fin annealed to form round nanowire structures in accordance with the present principles.

Referring to FIG. 10, a perspective view of a nanowires 140, 142 is shown in accordance with the present principles. The nanowires 140, 142 may be formed by performing a hydrogen anneal on the structure of FIG. 8. The hydrogen anneal rounds out the cross-sectional shape of the fins 16, 34 to form nanowires 140 and 142. The nanowires may be constructed into field effect transistor devices or other devices. The nanowires 140 and 142 may include Si and SiGe and be employed, respectively for NFET devices or PFET devices.

Figure 11:
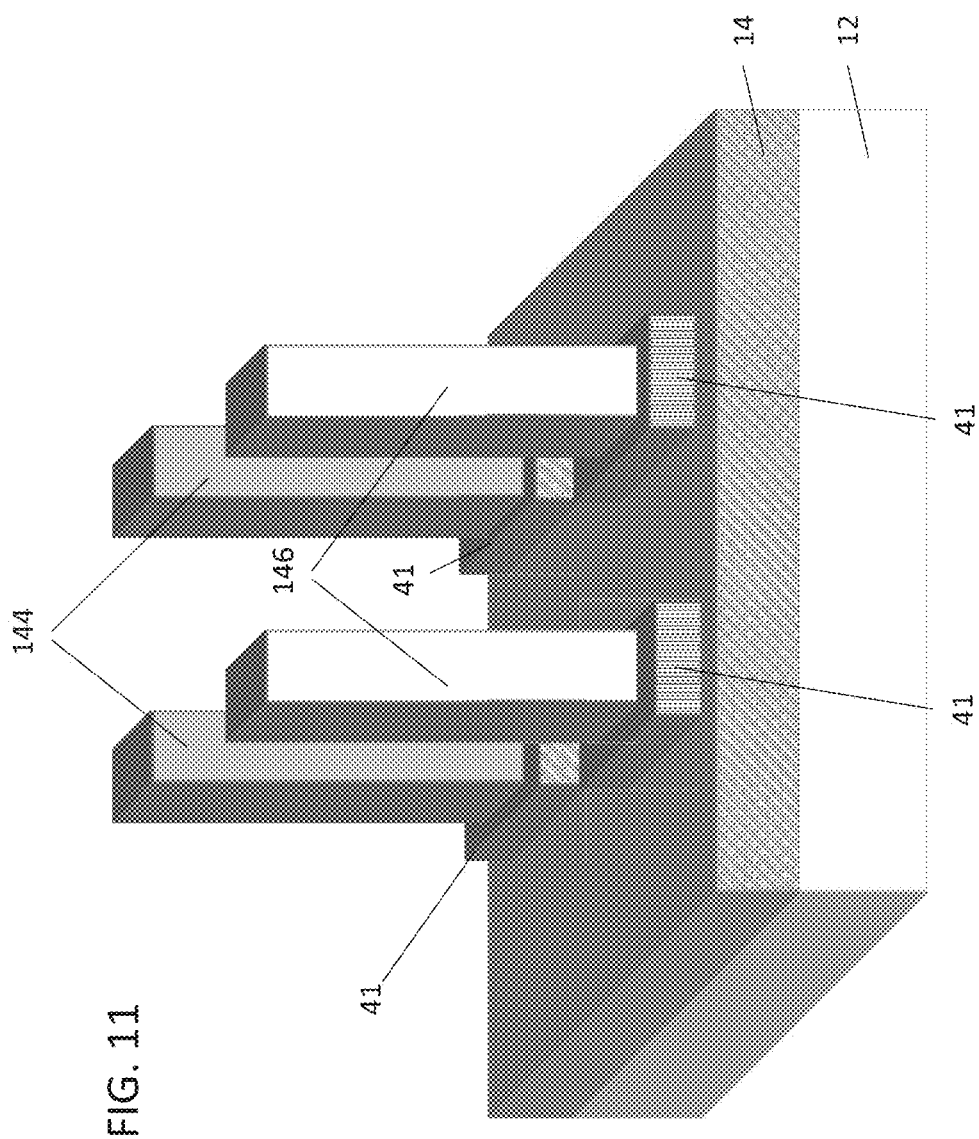
FIG. 11 is a perspective view showing columnar Si fins and SiGe fins forming vertical nanowire structures in accordance with the present principles.

Referring to FIG. 11, a perspective view of a nanowires 144, 146 is shown in accordance with the present principles. The nanowires 144, 146 are formed in a vertical or columnar orientation. This configuration may be employed by patterning fins as columns instead of longitudinal fins in the process of FIGS. 1-7, as described above. Alternately, fins may be processed to form the column fins after the process of FIGS. 1-7 (e.g., by performing an additional patterning process).

A pedestal 41 is formed as a base for each columnar nanowire 144, 146. A hydrogen anneal may also be employed to round out the nanowires 144, 146 as described above. The nanowires may be constructed into field effect transistor devices or other devices. The nanowires 144 and 146 may include Si and SiGe and be employed, respectively for NFET devices or PFET devices. The nanowires 144 and 146 may include one or more of a same width, depth and/or height.

Figure 12:
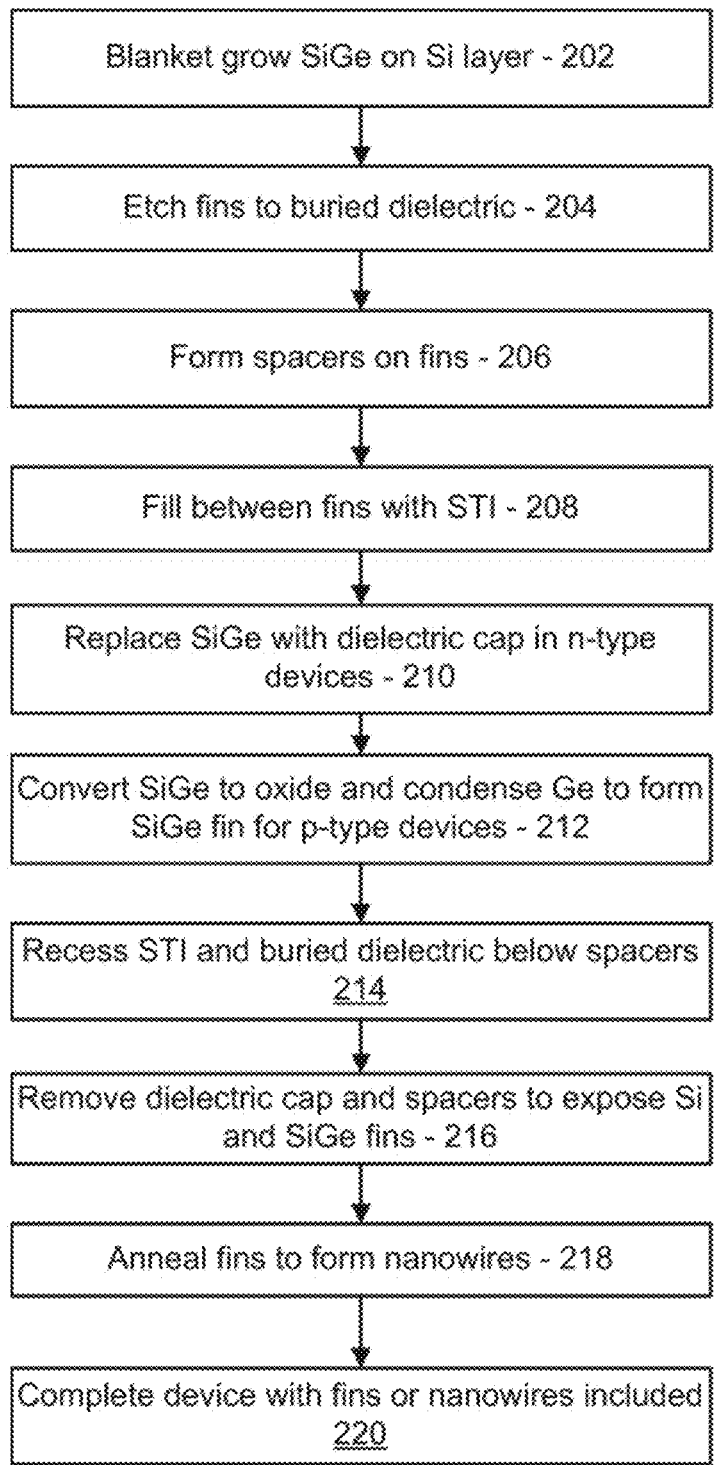
FIG. 12 is a block/flow diagram showing methods for forming complementary metal oxide semiconductor (CMOS) devices in accordance with illustrative embodiments.

Referring to FIG. 12, methods for forming complementary metal oxide semiconductor (CMOS) devices are shown in accordance with the present principles. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 202, a SiGe layer is grown on a Si layer. The Si layer may include a semiconductor layer of a SOI substrate or may be a processed bulk substrate. In block 204, fins are etched through the SiGe layer and the Si layer down to a buried dielectric layer. The SiGe layer may be epitaxially grown on the Si semiconductor layer as a blanket layer. The fins may be patterned to form longitudinal (horizontal) fins through the SiGe layer and the Si semiconductor layer or columnar fins (vertical) through the SiGe layer and the Si semiconductor layer.

In block 206, spacers are formed on sidewalls of the fins. This may include a conformal deposition followed by an etch back process. In block 208, a fill is formed between the fins using a dielectric material (STI) on top of the buried dielectric layer. In block 210, the SiGe layer is replaced with a dielectric cap for n-type devices to form a Si fin. The SiGe may be removed, by blocking the fins to be formed into p-type devices (e.g., using a mask or blocking layer). Then, a void where the SiGe layer was removed is filled with a cap layer.

In block 212, the Si layer is converted to a SiGe fin for p-type devices by oxidizing the SiGe layer to condense Ge. The SiGe layer becomes silicon oxide and the Si layer (lower portion) receives condensed out Ge to form SiGe. The Si layer may be converted to the SiGe fin by exposing the SiGe layer to oxygen or oxygen plasma at a temperature of between about 400 degrees C. to about 1050 degrees C. for one or more cycles.

In block 214, the dielectric material is recessed to below the spacers. This forms a step in the buried dielectric layer. In block 216, the dielectric cap and the spacers are removed to expose the Si fin and the SiGe fin. The Si fin and the SiGe fin are formed on pedestals formed by the step.

In block 218, the Si fin and the SiGe fin may be annealed (e.g., a hydrogen anneal) to round off corners of the Si fin and the SiGe fin. The Si fin and the SiGe fin with rounded off corners may form nanowires (which may include at least one of longitudinal or vertical nanowires).

In block 220, the fins or nanowires may be employed in FET devices. A finFET device or nanowire may include a gate structure or structures (e.g., formed transversely to the Si fins and the SiGe fins) or formed on or adjacent to the nanowires. Source and drain regions may be formed on the Si fins and the SiGe fins (or nanowires). The source and drain regions may be epitaxially grown on the fins. Additional steps are employed to complete the CMOS device. For example, additional steps may include forming contacts, forming metal lines, etc.

Having described preferred embodiments for finFET CMOS with a Si NFET and a SiGe PFET (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A complementary metal oxide semiconductor (CMOS) device, comprising:
   pedestals with vertical sidewalls formed from a buried dielectric layer;
   a SiGe fin and a Si fin, each formed on the pedestals, the SiGe fin and the Si fin including a same or substantially the same width dimension, wherein the pedestals extend wider than the SiGe fin and the Si fin for the entire length of the fins; and
   epitaxial source and drain regions including a first epitaxial region grown from the SiGe fin and a second epitaxially region grown from the Si fin.

2. The device as recited in claim 1, wherein the SiGe fin and the Si fin include longitudinal fins.

3. The device as recited in claim 1, further comprising round corners on the Si fin and the SiGe fin.

4. The device as recited in claim 1, wherein the Si fin and the SiGe fin form nanowires.

5. The device as recited in claim 4, wherein the nanowires include longitudinal nanowires.

6. The device as recited in claim 1, wherein the pedestals extend wider than the SiGe fin and the Si fin on a surface that is in direct contact with the SiGe fin and the Si fin.

7. A Fin Field Effect Transistor (finFET) device, comprising:
   pedestals formed from a buried dielectric layer;
   a plurality of fins, the plurality of fins alternating between SiGe fins and Si fins, each formed on the pedestals, the SiGe fins and Si fins including a same or substantially the same width dimension, which is narrower than the pedestal width for the entire length of the fins; and
   epitaxial source and drain regions grown from the SiGe and Si fins on opposite sides of a gate structure, and wherein the gate structure includes a conductor formed over the fins.

8. The device as recited in claim 7, wherein the SiGe fins and the Si fins include longitudinal fins.

9. The device as recited in claim 7, further comprising round corners formed on the Si fins and the SiGe fins.

10. The device as recited in claim 7, wherein the Si fins and the SiGe fins form nanowires.

11. The device as recited in claim 10, wherein the nanowires include longitudinal nanowires.

12. The device as recited in claim 1, wherein the device includes a Multiple Gate Field Effect Transistor (MuGFET) device.

13. The device as recited in claim 7, wherein the pedestals extend wider than the SiGe fins and the Si fins on a surface that is in direct contact with the SiGe fins and the Si fins.

14. The device as recited in claim 7, wherein the pedestals include vertical sidewalls.

15. The device as recited in claim 13, wherein the pedestals include vertical sidewalls.

* * * * *